US011187764B2

(12) United States Patent
Lassalle-Balier et al.

(10) Patent No.: US 11,187,764 B2
(45) Date of Patent: Nov. 30, 2021

(54) LAYOUT OF MAGNETORESISTANCE ELEMENT

(71) Applicant: Allegro MicroSystems, LLC, Manchester, NH (US)

(72) Inventors: Rémy Lassalle-Balier, Bures sur Yvette (FR); Amal Hamdache, Limours (FR); Julien Voillot, Chilly Mazarin (FR); Paolo Campiglio, Arcueil (FR)

(73) Assignee: Allegro MicroSystems, LLC, Manchester, NH (US)

( * ) Notice: Subject to any disclaimer, the term of this patent is extended or adjusted under 35 U.S.C. 154(b) by 155 days.

(21) Appl. No.: 16/825,368

(22) Filed: Mar. 20, 2020

(65) Prior Publication Data

US 2021/0293911 A1    Sep. 23, 2021

(51) Int. Cl.
  *G01R 33/09*    (2006.01)
  *G01V 3/08*    (2006.01)
  *G01R 15/20*    (2006.01)
  *G01D 5/16*    (2006.01)

(52) U.S. Cl.
  CPC ............ *G01R 33/098* (2013.01); *G01D 5/16* (2013.01); *G01R 15/205* (2013.01); *G01V 3/08* (2013.01)

(58) Field of Classification Search
  CPC ........... G01V 3/08; G01R 15/205; G01D 5/16
  See application file for complete search history.

(56) References Cited

U.S. PATENT DOCUMENTS

| 3,858,189 | A | 12/1974 | Beausoleil et al. |
| 3,860,965 | A | 1/1975 | Voegeli |
| 4,035,785 | A | 7/1977 | Kryder |
| 4,078,230 | A | 3/1978 | George |
| 4,159,537 | A | 6/1979 | Schwartz |
| 4,343,026 | A | 8/1982 | Griffith et al. |

(Continued)

FOREIGN PATENT DOCUMENTS

| DE | 42 12 737 C1 | 7/1993 |
| DE | 196 50 078 A1 | 6/1998 |

(Continued)

OTHER PUBLICATIONS

U.S. Appl. No. 16/507,544, filed Jul. 10, 2019, David et al.

(Continued)

*Primary Examiner* — Alvaro E Fortich
(74) *Attorney, Agent, or Firm* — Daly, Crowley, Mofford & Durkee, LLP (57) ABSTRACT

In one aspect, a bridge includes a first magnetoresistance element that includes a first set of pillars, a second magnetoresistance element that includes a second set of pillars, a third magnetoresistance element that includes a third set of pillars and a fourth magnetoresistance element that includes a fourth set of pillars. The first set of pillars and the fourth set of pillars are disposed in a first matrix and the second set of pillars and the third set of pillars are disposed in a second matrix. The second magnetoresistance element is in series with the first magnetoresistance element, the third magnetoresistance element is in parallel with the first magnetoresistance element and the fourth magnetoresistance element is in series with the third magnetoresistance element.

21 Claims, 7 Drawing Sheets

(56) References Cited

U.S. PATENT DOCUMENTS

| | | |
|---|---|---|
| 4,432,069 A | 2/1984 | Rose et al. |
| 4,525,668 A | 6/1985 | Lienhard et al. |
| 4,596,950 A | 6/1986 | Lienhard et al. |
| 4,691,259 A | 9/1987 | Imakoshi |
| 4,712,064 A | 12/1987 | Eckardt et al. |
| 4,823,075 A | 4/1989 | Alley |
| 4,847,584 A | 7/1989 | Pant |
| 4,860,432 A | 8/1989 | Kawata |
| 4,937,521 A | 6/1990 | Yoshino et al. |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,227,721 A | 7/1993 | Kataoka et al. |
| 5,260,653 A | 11/1993 | Smith et al. |
| 5,500,590 A | 3/1996 | Pant |
| 5,561,368 A | 10/1996 | Dovek et al. |
| 5,570,034 A | 10/1996 | Needham et al. |
| 5,583,725 A | 12/1996 | Coffey et al. |
| 5,617,071 A | 4/1997 | Daughton |
| 5,621,377 A | 4/1997 | Dettmann et al. |
| 5,686,838 A | 11/1997 | van den Berg |
| 5,719,494 A | 2/1998 | Dettmann et al. |
| 5,831,426 A | 11/1998 | Black, Jr. et al. |
| 5,877,705 A | 3/1999 | Sampey |
| 5,945,825 A | 8/1999 | Clemens |
| 5,952,825 A | 9/1999 | Wan |
| 6,002,553 A | 12/1999 | Stearns et al. |
| 6,021,065 A | 2/2000 | Daughton et al. |
| 6,031,273 A | 2/2000 | Torok et al. |
| 6,100,686 A | 8/2000 | Van Delden et al. |
| 6,175,296 B1 | 1/2001 | Tokunaga et al. |
| 6,300,617 B1 | 10/2001 | Daughton et al. |
| 6,315,875 B1 | 11/2001 | Sasaki |
| 6,316,931 B1 | 11/2001 | Nakagawa et al. |
| 6,323,634 B1 | 11/2001 | Nakagawa et al. |
| 6,329,818 B1 | 12/2001 | Tokunaga et al. |
| 6,331,773 B1 | 12/2001 | Engel |
| 6,392,852 B1 | 5/2002 | Sasaki |
| 6,404,191 B2 | 6/2002 | Daughton et al. |
| 6,411,078 B1 | 6/2002 | Nakagawa et al. |
| 6,429,640 B1 | 8/2002 | Daughton et al. |
| 6,437,558 B2 | 8/2002 | Li et al. |
| 6,445,171 B2 | 9/2002 | Sandquist et al. |
| 6,459,255 B1 | 10/2002 | Tamai et al. |
| 6,462,541 B1 | 10/2002 | Wang et al. |
| 6,501,678 B1 | 12/2002 | Lenssen et al. |
| 6,566,856 B2 | 5/2003 | Sandquist et al. |
| 6,591,481 B2 | 7/2003 | Shimazawa et al. |
| 6,642,705 B2 | 11/2003 | Kawase |
| 6,657,826 B2 | 12/2003 | Shimazawa et al. |
| 6,664,785 B2 | 12/2003 | Kohlstedt |
| 6,667,682 B2 | 12/2003 | Wan et al. |
| 6,693,826 B1 | 2/2004 | Black et al. |
| 6,721,140 B2 | 4/2004 | Inoue et al. |
| 6,759,841 B2 | 7/2004 | Goto et al. |
| 6,781,359 B2 | 8/2004 | Stauth et al. |
| 6,788,568 B2 | 9/2004 | Hidaka |
| 6,967,798 B2 | 11/2005 | Homola et al. |
| 6,970,333 B2 | 11/2005 | Boeve |
| 7,071,074 B2 | 7/2006 | Schmidt et al. |
| 7,248,045 B2 | 7/2007 | Shoji |
| 7,259,545 B2 | 8/2007 | Stauth et al. |
| 7,336,064 B2 | 2/2008 | Ludwig et al. |
| 7,495,624 B2 | 2/2009 | Daalmans |
| 7,777,607 B2 | 8/2010 | Taylor et al. |
| 7,795,862 B2 | 9/2010 | Doogue et al. |
| 10,114,085 B2 | 10/2018 | Eagen et al. |
| 10,330,745 B2 | 6/2019 | Eagen et al. |
| 10,605,874 B2 | 3/2020 | Lassalle-Balier et al. |
| 2002/0024337 A1 | 2/2002 | Levert et al. |
| 2002/0180433 A1 | 12/2002 | Van Zon et al. |
| 2002/0186011 A1 | 12/2002 | Murata et al. |
| 2004/0023064 A1 | 2/2004 | Ehresmann et al. |
| 2004/0137275 A1 | 7/2004 | Jander et al. |
| 2005/0007834 A1 | 1/2005 | Hidaka |
| 2006/0071655 A1 | 4/2006 | Shoji |
| 2006/0077598 A1 | 4/2006 | Taylor et al. |
| 2006/0087318 A1 | 4/2006 | Crolly et al. |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0291106 A1 | 12/2006 | Shoji |
| 2007/0044370 A1 | 3/2007 | Shoji |
| 2007/0076332 A1 | 4/2007 | Matus et al. |
| 2007/0090825 A1 | 4/2007 | Shoji |
| 2007/0096716 A1 | 5/2007 | Shoji |
| 2007/0134921 A1 | 6/2007 | Tian et al. |
| 2007/0188946 A1 | 8/2007 | Shoji |
| 2007/0247144 A1 | 10/2007 | Tokuhara et al. |
| 2007/0247943 A1 | 10/2007 | Sato et al. |
| 2008/0309331 A1 | 12/2008 | Qian et al. |
| 2010/0308923 A1* | 12/2010 | Kaka .................. H03B 15/006 |
| | | 331/46 |
| 2010/0327857 A1 | 12/2010 | Hoshiya et al. |
| 2011/0062537 A1 | 3/2011 | Oh et al. |
| 2011/0163739 A1 | 7/2011 | Ono et al. |
| 2012/0112741 A1 | 5/2012 | Meguro et al. |
| 2015/0194430 A1* | 7/2015 | Karda ............... H01L 27/10879 |
| | | 257/331 |
| 2017/0033283 A1* | 2/2017 | Pinarbasi ................ H01L 43/12 |
| 2017/0302280 A1* | 10/2017 | Vaysset .................. H03K 19/18 |
| 2019/0178954 A1 | 6/2019 | Lassalle-Balier et al. |
| 2021/0280348 A1* | 9/2021 | Bortolotti ............. H01F 10/329 |

FOREIGN PATENT DOCUMENTS

| | | |
|---|---|---|
| DE | 100 17 374 A1 | 12/2000 |
| DE | 101 59 607 A1 | 9/2002 |
| DE | 101 28 150 C1 | 1/2003 |
| DE | 10 155 423 A1 | 5/2003 |
| DE | 102 02 287 C1 | 8/2003 |
| DE | 102 22 395 A1 | 12/2003 |
| DE | 10 2004 003 369 A1 | 8/2005 |
| DE | 10 2004 009 267 B3 | 9/2005 |
| DE | 10 2004 038 847 B3 | 9/2005 |
| DE | 10 2004 040 079 B3 | 12/2005 |
| DE | 10 2005 037 905 A1 | 3/2006 |
| DE | 10 2004 053 551 A1 | 5/2006 |
| DE | 10 2006 008 257 A1 | 10/2006 |
| DE | 10 2006 021 774 A1 | 1/2007 |
| DE | 10 2005 038 665 B3 | 3/2007 |
| DE | 10 2005 040 539 A1 | 3/2007 |
| DE | 10 2005 052 688 A1 | 5/2007 |
| DE | 10 2006 007 770 A1 | 8/2007 |
| DE | 10 2006 028 698 | 12/2007 |
| EP | 0 539 081 A1 | 4/1993 |
| EP | 0 710 850 A2 | 5/1996 |
| EP | 1 720 027 A1 | 11/2006 |
| JP | 57187671 A | 11/1982 |
| JP | 42 12 737 A | 8/1992 |
| JP | 2000-174358 | 6/2000 |
| JP | 2001-345498 A | 12/2001 |
| JP | 2002-353418 | 12/2002 |
| JP | 2003-179283 | 6/2003 |
| JP | 2003-525528 | 8/2003 |
| JP | 2004-117367 A | 4/2004 |
| JP | 2006-126087 A | 5/2006 |
| WO | WO 2004/109725 A1 | 12/2004 |
| WO | WO 2005/064357 A2 | 7/2005 |
| WO | WO 2006/040719 A1 | 4/2006 |
| WO | WO 2006/136577 A1 | 12/2006 |
| WO | WO 2007/147760 A2 | 12/2007 |

OTHER PUBLICATIONS

Analog Devices Inc., "High-Speed Digital Isolators, AduM1100AR/ AduM1100BR;" Data Sheet; Jan. 2001; 12 Pages.
NVE Corporation, "Utilization of GMR Materials. Analog Bridge Output Devices;" Retrieved from: www.nve.com/technical/explinations// Bridge.html; 3 Pages.

(56) References Cited

OTHER PUBLICATIONS

Daughton et al.; "Magnetic Field Sensors Using GMR Multilayer", IEEE Transactions on Magnetics, vol. 30, No. 6; Nov. 1, 1994; pp. 4608-4610; 3 Pages.
Hirota et al.; "Giant Magneto-Resistance Devices;" Springer Series in Surface Sciences, 40; ISBN-10:3540418199; ISBN-13: 9783540418191; 9 Pages.
Prinz; "Magnetoelectronics Applications;" Journal of Magnetism and Magnetic Materials, Elsevier Science Publishers; vol. 200, No. 1-3; Oct. 1, 1999; pp. 57-68; XP004364006; ISSN: 0304-8853; 12 Pages.
Spong et al.; "Giant Magnetoresistive Spin Valve Bridge Sensor;" IEEE Transactions on Magnetics; vol. 32, No. 2; Mar. 1, 1996; pp. 366-371; XP011030196; ISSN: 0018-9464; 6 Pages.
Takenaga et al., "High-Temperature Operations of Rotation Angle Sensors With Spin-Valve-Type Magnetic Tunnel Junctions;" IEEE Transactions on Magnetics; vol. 41, No. 10; Oct. 2005; pp. 3628-3630; 3 Pages.
PCT International Search Report and Written Opinion dated Jan. 18, 2006 for International Appln. No. PCT/US2005/029982; 13 Pages.
PCT International Preliminary Report dated Apr. 17, 2007 for International Application No. PCT/US2005/029982; 7 Pages.
Letter from Japanese Attorney dated Apr. 12, 2010 and Translation of Japanese Office Action dated Feb. 19, 2010 for Japanese Application No. 2007-536689; 5 Pages.
European 1$^{st}$ Official Communication dated Apr. 25, 2008 for European Application No. 05794713.7; 7 Pages.
Response to European 1$^{st}$ Official Communication dated Apr. 25, 2008 for EP Application No. 05794713.7; Response filed Nov. 5, 2008; 15 Pages.
European 2$^{nd}$ Official Communication dated Oct. 2, 2009 for European Application No. 05794713.7; 6 Pages.
Response to European 2$^{nd}$ Official Communication dated Oct. 2, 2009 for European Application No. 05794713.7; Response filed Apr. 12, 2010; 11 Pages.
European Notice of Allowance dated Nov. 11, 2011 for European Application No. 05794713.7; 6 Pages.
Response (with Machine English Translation) to 1$^{st}$ Japanese Office Action dated Feb. 19, 2010 for Japanese Application No. 2007-536689; Response filed Jun. 21, 2010; 14 Pages.
Japanese 2$^{nd}$ Office Action (with Machine English Translation) dated Aug. 13, 2010 for Japanese Application No. 2007-536689; 5 Pages.
Response (with Machine English Translation) to 2$^{nd}$ Japanese Office Action dated Aug. 13, 2010 for Japanese Application No. 2007-536689; Response filed Dec. 17, 2010; 4 Pages.
Japanese Decision to Grant (with Machine English Translation) dated Mar. 8, 2011 for Japanese Application No. 2007-536689; 5 Pages.
Japanese 1$^{st}$ Office Action (with Machine English Translation) dated Feb. 16, 2012 for Japanese Application No. 2010-281172; 4 Pages.
Response (with Machine English Translation) to Japanese 1$^{st}$ Office Action dated Feb. 16, 2012 for Japanese Application No. 2010-281172; Response filed May 18, 2012; 8 Pages.
Japanese 2$^{nd}$ Office Action (with Machine English Translation) dated Nov. 6, 2012 for Japanese Application No. 2010-281172; 4 Pages.
Request for Appeal (with Machine English Translation) Filed in Response to Japanese 2$^{nd}$ Office Action dated Nov. 6, 2012 for Japanese Application No. 2010-281172; Request for Appeal filed Mar. 8, 2013; 14 Pages.
Trial and Appeal Decision (with Machine English Translation) dated Apr. 4, 2014 for Japanese Application No. 2010-281172; 13 Pages.
Japanese Office Action (with Machine English Translation) dated Feb. 27, 2014 for Japanese Application No. 2013-046521; 4 Pages.
Response (with Machine English Translation) to Japanese Office Action dated Feb. 27, 2014 for Japanese Application No. 2013-046521; Response filed Aug. 4, 2014; 6 Pages.
Japanese Decision to Grant (with Machine English Translation) dated Sep. 29, 2014 for Japanese Application No. 2013-046521; 5 Pages.
U.S. Non-Final Office Action dated Jan. 4, 2007 for U.S. Appl. No. 10/962,889; 9 Pages.
Response to U.S. Non-Final Office Action dated Jan. 4, 2007 for U.S. Appl. No. 10/962,889; Response filed Apr. 4, 2007; 14 Pages.
U.S. Final Office Action dated Jun. 12, 2007 for U.S. Appl. No. 10/962,889; 8 Pages.
Response to U.S. Final Office Action dated Jun. 12, 2007 for U.S. Appl. No. 10/962,889; Response filed Aug. 3, 2007; 8 Pages.
U.S. Advisory Action dated Aug. 16, 2007 for U.S. Appl. No. 10/962,889; 3 Pages.
U.S. Appeal Brief filed Nov. 26, 2007 for U.S. Appl. No. 10/962,889; 12 Pages.
U.S. Non-Compliant Appeal Brief dated Mar. 3, 2008 for U.S. Appl. No. 10/962,889; 2 Pages.
Response to U.S. Non-Compliant Appeal Brief dated Mar. 3, 2008 for U.S. Appl. No. 10/962,889; Response filed Mar. 17, 2008; 12 Pages.
U.S. Examiners Answer dated Jun. 23, 2008 for U.S. Appl. No. 10/962,889; 6 Pages.
U.S. Decision on Appeal dated Nov. 3, 2009 for U.S. Appl. No. 10/962,889; 7 Pages.
U.S. 1$^{st}$ Notice of Allowance dated Feb. 17, 2010 for U.S. Appl. No. 10/962,889; 5 Pages.
U.S. 2$^{nd}$ Notice of Allowance dated Jun. 1, 2010 for U.S. Appl. No. 10/962,889; 14 Pages.

\* cited by examiner

LAYOUT OF MAGNETORESISTANCE ELEMENT

BACKGROUND

Bridges typically include four or more magnetoresistance elements. Magnetoresistance elements in a bridge may include tunnel magnetoresistance (TMR) elements. Each TMR element may include a plurality of pillars. Generally, in fabricating bridges, pillars of each TMR element are grouped together on a die in a location separate from the pillars of the other TMR elements.

SUMMARY

In one aspect, a bridge includes a first magnetoresistance element that includes a first set of pillars, a second magnetoresistance element that includes a second set of pillars, a third magnetoresistance element that includes a third set of pillars and a fourth magnetoresistance element that includes a fourth set of pillars. The first set of pillars and the fourth set of pillars are disposed in a first matrix and the second set of pillars and the third set of pillars are disposed in a second matrix. The second magnetoresistance element is in series with the first magnetoresistance element, the third magnetoresistance element is in parallel with the first magnetoresistance element and the fourth magnetoresistance element is in series with the third magnetoresistance element.

In another aspect, a magnetic-field sensor includes a bridge. The bridge includes a first magnetoresistance element that includes a first set of pillars, a second magnetoresistance element that includes a second set of pillars, a third magnetoresistance element that includes a third set of pillars and a fourth magnetoresistance element that includes a fourth set of pillars. The first set of pillars and the fourth set of pillars are disposed in a first matrix and the second set of pillars and the third set of pillars are disposed in a second matrix. The second magnetoresistance element is in series with the first magnetoresistance element, the third magnetoresistance element is in parallel with the first magnetoresistance element and the fourth magnetoresistance element is in series with the third magnetoresistance element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to form magnetoresistance elements using different layouts on a die (i.e., integrated circuit) that co-locate pillars of different magnetoresistance elements together. In one example, the magnetoresistance elements are tunnel magnetoresistance (TMR) elements. In one example, the pillars of one TMR element is interleaved with pillars from another TMR element. The techniques described herein may reduce mismatches and artifacts that may develop when TMR elements are used in bridges. The techniques described herein may also reduce laser pinning time, which, for example, may be reduced by a factor of two in most applications.

Figure 1A:
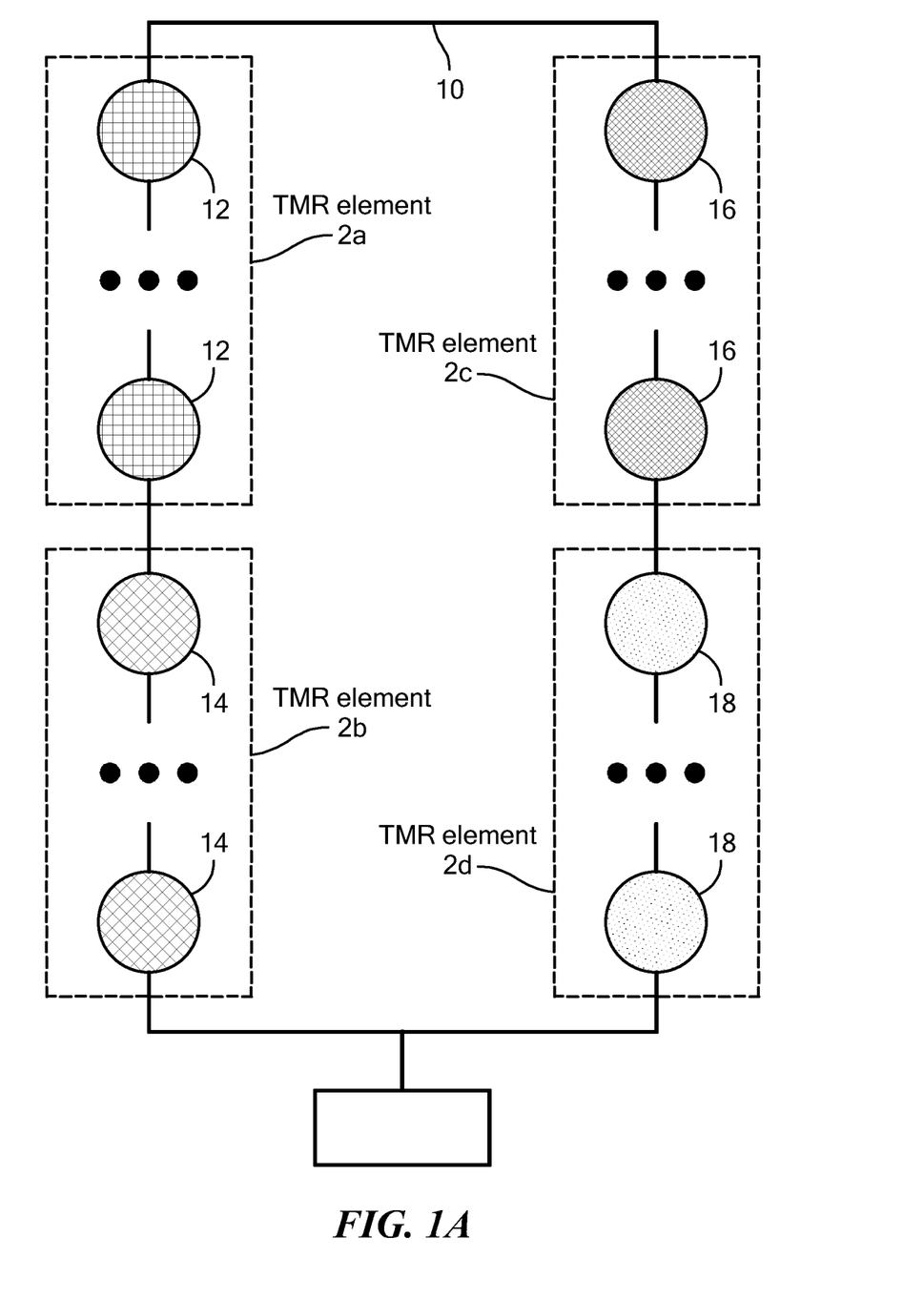
FIG. 1A is a block diagram of an example of a bridge including tunnel magnetoresistance (TMR) elements with pillars.

Referring to FIG. 1A, a bridge 10 includes at least four magnetoresistance elements (e.g., a tunnel magnetoresistance element (TMR) element 2a, a TMR element 2b, a TMR element 2c and a TMR element 2d). The TMR elements 2a, 2b are in series with each other and the TMR elements 2c, 2d are in series with each other. The TMR elements 2a, 2b are in parallel with the TMR elements 2c, 2d. The TMR element 2a includes a first set of pillars 12, the TMR element 2b includes a second set of pillars 14, the TMR element 2c includes a third set of pillars 16 and the TMR element 2d includes a fourth set of pillars 18. In one example, the TMR element 2a may have the same reference direction as the TMR element 2d, and the TMR element 2b may have the same reference direction as the TMR element 2c.

In one example, pillars in a set of pillars may be connected in series. In another example, pillars in a set of pillars may be connected in parallel. In a further example, some pillars in a set of pillars may be connected in parallel and other pillars may be connected in series.

Figure 1B:
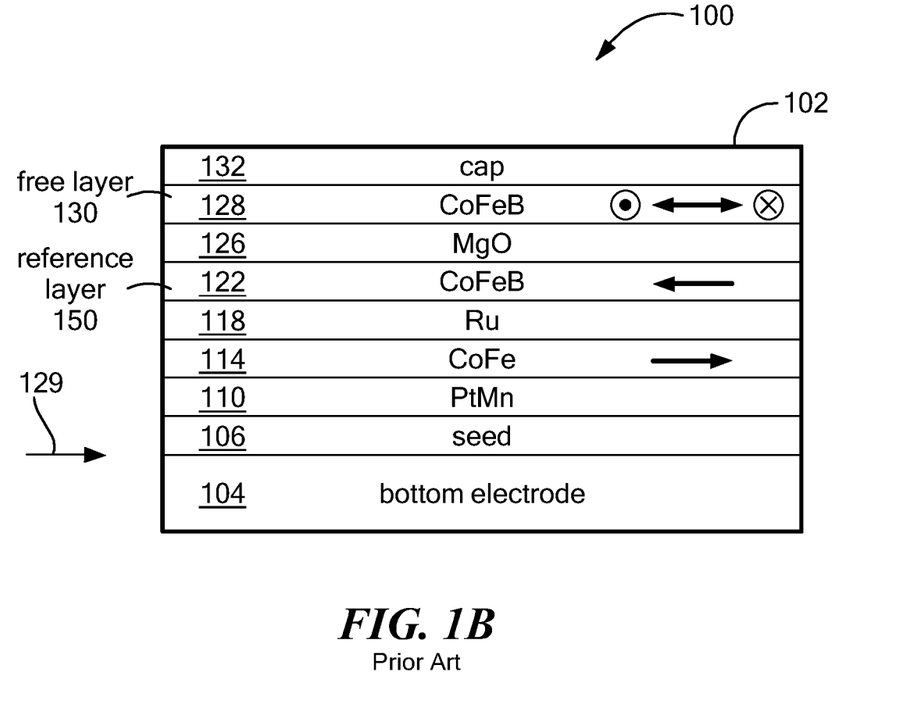
FIG. 1B is a diagram of an example of a pillar of a TMR element.

Referring to FIG. 1B, an illustrative TMR element 100 can have a stack 102 of layers 106, 110, 114, 118, 122, 126, 128, 132 indicative of one pillar of a multi-pillar TMR element. Generally, the layer 106 is a seed layer (e.g., a copper nickel (CuN) layer) with the layer 110 located on the seed layer 106. The layer 110 includes platinum manganese (PtMn) or iridium manganese (IrMn), for example. The layer 114 is located on the layer 110 and the layer 118 is located on the layer 114. In one example, the layer 114 includes cobalt iron (CoFe) and the layer 118 is a spacer layer and includes ruthenium (Ru). On the layer 118, a magnesium oxide (MgO) layer 126 is sandwiched between two cobalt iron boron (CoFeB) layers 122, 128. A cap layer 132 (e.g., tantalum (Ta)) is located on the CoFeB layer 128. The layer 114 is a single layer pinned layer that is magnetically coupled to the layer 110. The physical mechanism that is coupling layers 110 and 114 together is sometimes called an exchange bias.

A free layer 130 includes the CoFeB layer 128. In some examples, the free layer 130 may include an additional layer of nickel iron (NiFe) (not shown) and a thin layer of tantalum (not shown) between the CoFeB layer 128 and the NiFe layer.

It will be understood that a driving current running through the TMR element 100 runs through the layers of the stack, running between seed and cap layers 106 and 132, i.e., perpendicular to a surface of a bottom electrode 104. The TMR element 100 can have a maximum response axis that is parallel to the surface of the bottom electrode 104 and that is in a direction 129, and also parallel to the magnetization direction of a reference layer 150 that includes the layer CoFeB 122.

The TMR element 100 has a maximum response axis (maximum response to external fields) aligned with the arrow 129, i.e., perpendicular to bias directions experienced by the free layer 130, and parallel to magnetization of the reference layer 150, notably pinned layer 122. Also, in general, it is rotations of the magnetic direction of the free layer 130 caused by external magnetic fields that result in changes of resistance of the TMR element 100, which may be due to a change in angle or a change in amplitude if an external bias is present because the sum vector of the external field and the bias is causing a change in the angle between the reference and free layers.

Figure 2:
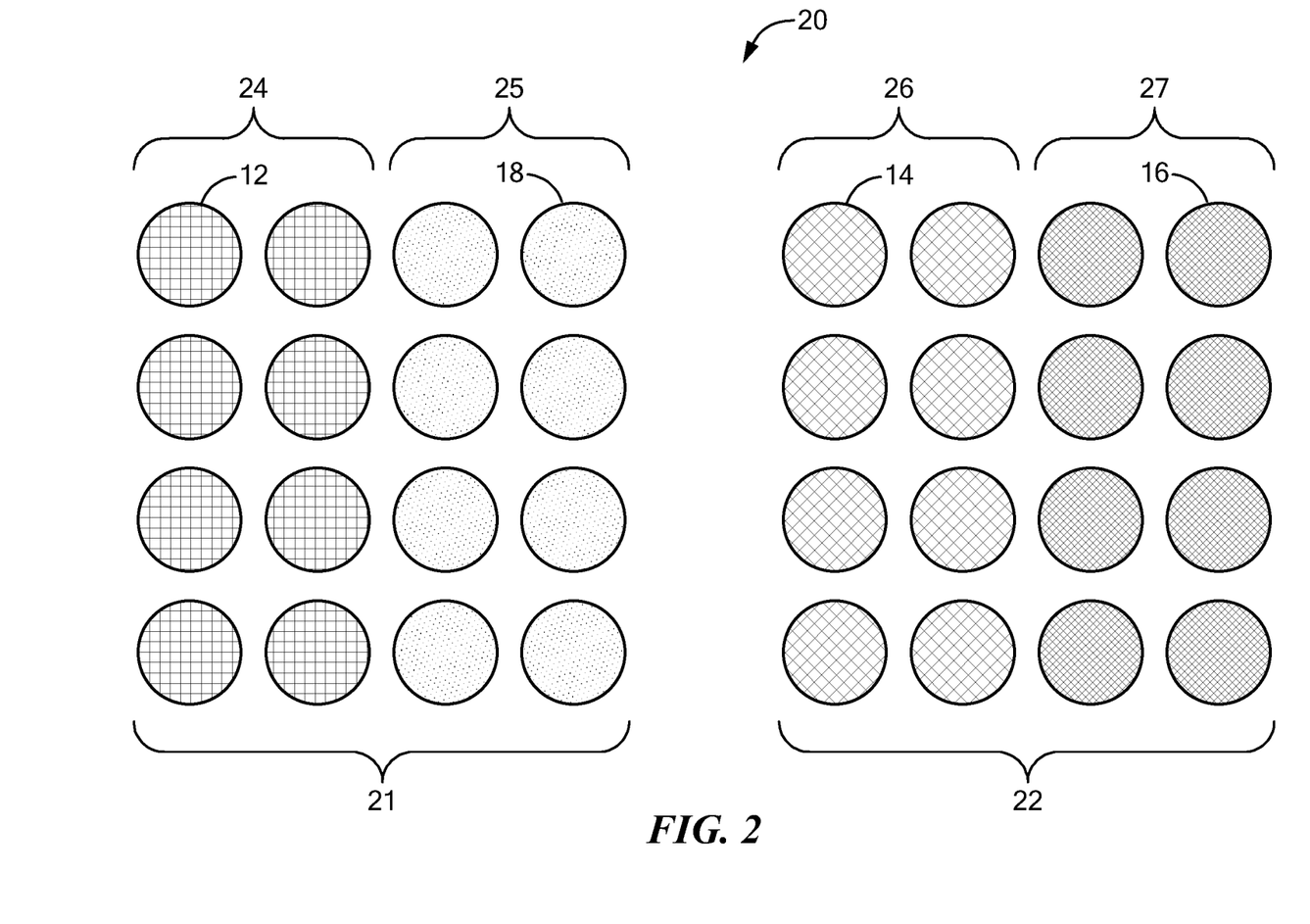
FIG. 2 is a diagram of an example of a layout of a TMR element.

Referring to FIG. 2, an example of a layout for the pillars is a layout 20. The layout 20 includes a first matrix 21 and a second matrix 22. In one example, a first matrix 21 is separated from the second matrix 22 by about 10 to 90 microns.

The first matrix 21 includes pillars from the first set of pillars 12 and the fourth set of pillars 18. The first matrix 21 includes a set of columns 24 adjacent to a set of columns 25. The set columns of columns 24 includes pillars from the first set of pillars 12. The set columns of columns 25 includes pillars from the first set of pillars 18.

The second matrix 22 includes pillars from the second set of pillars 14 and the third set of pillars 16. The second matrix 22 includes a set of columns 26 adjacent to a set of columns 26. The set columns of columns 26 includes pillars from the second set of pillars 14. The set columns of columns 27 includes pillars from the third set of pillars 16.

In one example, each pillar within a matrix is separated from the nearest pillar by about one to five microns.

Figure 3:
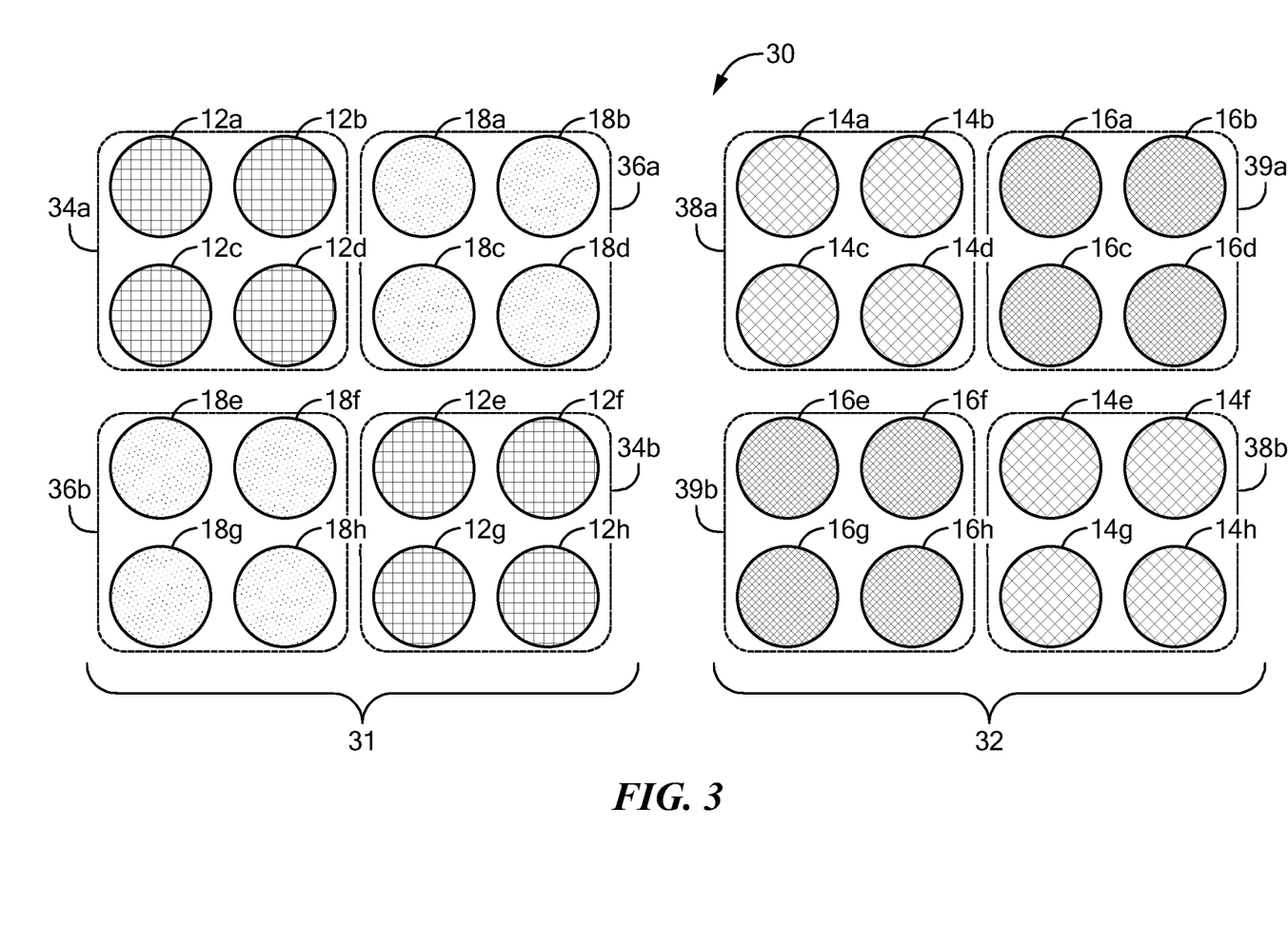
FIG. 3 is a diagram of another example of the layout of a TMR element.

Referring to FIG. 3, another example of a layout for the pillars is a layout 30. The layout 30 includes a first matrix 31 and a second matrix 32. In one example, a first matrix 31 is separated from the second matrix 32 by about 10 to 90 microns.

The first matrix 31 includes a submatrix 34a of pillars 12 (e.g., a pillar 12a, a pillar 12b, a pillar 12c, a pillar 12d), a submatrix 34b of pillars 12 (e.g., a pillar 12e, a pillar 12f, a pillar 12g, a pillar 12h), a submatrix 36a of pillars 18 (e.g., a pillar 18a, a pillar 18b, a pillar 18c, a pillar 18d), and a submatrix 36b of pillars 18 (e.g., a pillar 18e, a pillar 18f, a pillar 18g, a pillar 18h). The submatrices 34a, 34b are interleaved with the submatrices 36a, 36b.

The second matrix 32 includes a submatrix 38a of pillars 14 (e.g., a pillar 14a, a pillar 14b, a pillar 14c, a pillar 14d), a submatrix 38b of pillars 14 (e.g., a pillar 14e, a pillar 14f, a pillar 14g, a pillar 14h), a submatrix 39a of pillars 16 (e.g., a pillar 16a, a pillar 16b, a pillar 16c, a pillar 16d), and a submatrix 39b of pillars 16 (e.g., a pillar 16e, a pillar 16f, a pillar 16g, a pillar 16h). The submatrices 38a, 38b are interleaved with the submatrices 39a, 39b.

In one example, each pillar within a matrix is separated from the nearest pillar by about one to five microns.

Figure 4:
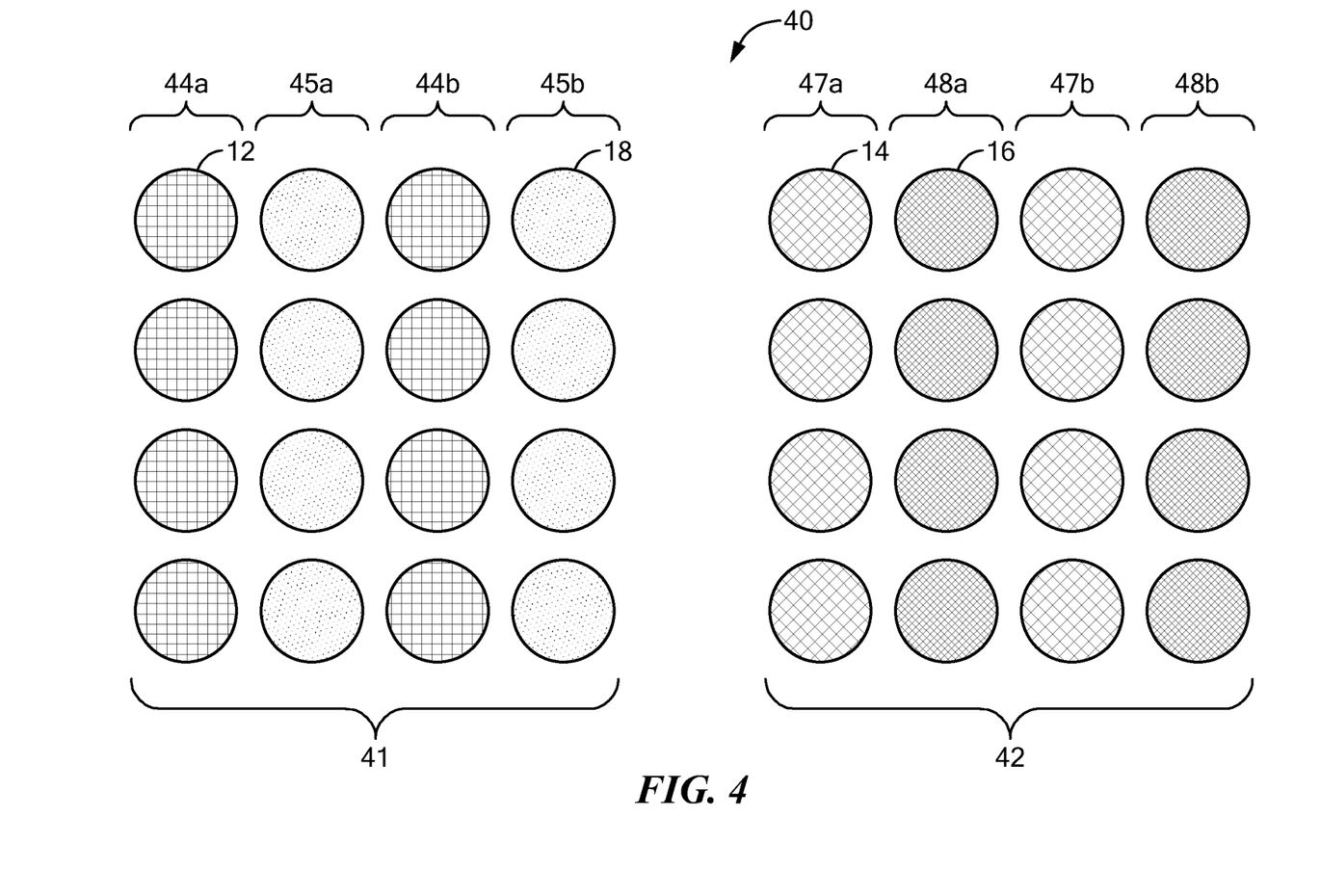
FIG. 4 is a diagram of a further example of the layout of a TMR element.

Referring to FIG. 4, a further example of a layout for the pillars is a layout 40. The layout 40 includes a first matrix 41 and a second matrix 42. In one example, a first matrix 41 is separated from the second matrix 42 by about 10 to 90 microns.

The first matrix 41 includes a column 44a of pillars 12, a column 44b of pillars 12, a column 45a of pillars 18 and a column 45b of pillars 18.

The columns 44a, 44b are interleaved with the columns 45a, 45b. In one particular example, the second matrix 42 includes columns alternating between columns having pillars 12 with columns having pillars 18. For example, the column 45a is between the columns 44a, 44b and the column 44b is between the columns 45a, 45b.

The columns 47a, 47b are interleaved with the columns 48a, 48b. In one particular example, the second matrix 42 includes columns alternating between columns having pillars 14 with columns having pillars 16. For example, the column 48a is between the columns 47a, 47b and the column 47b is between the columns 48a, 48b.

In one example, each pillar within a matrix is separated from the nearest pillar by about one to five microns.

Figure 5:
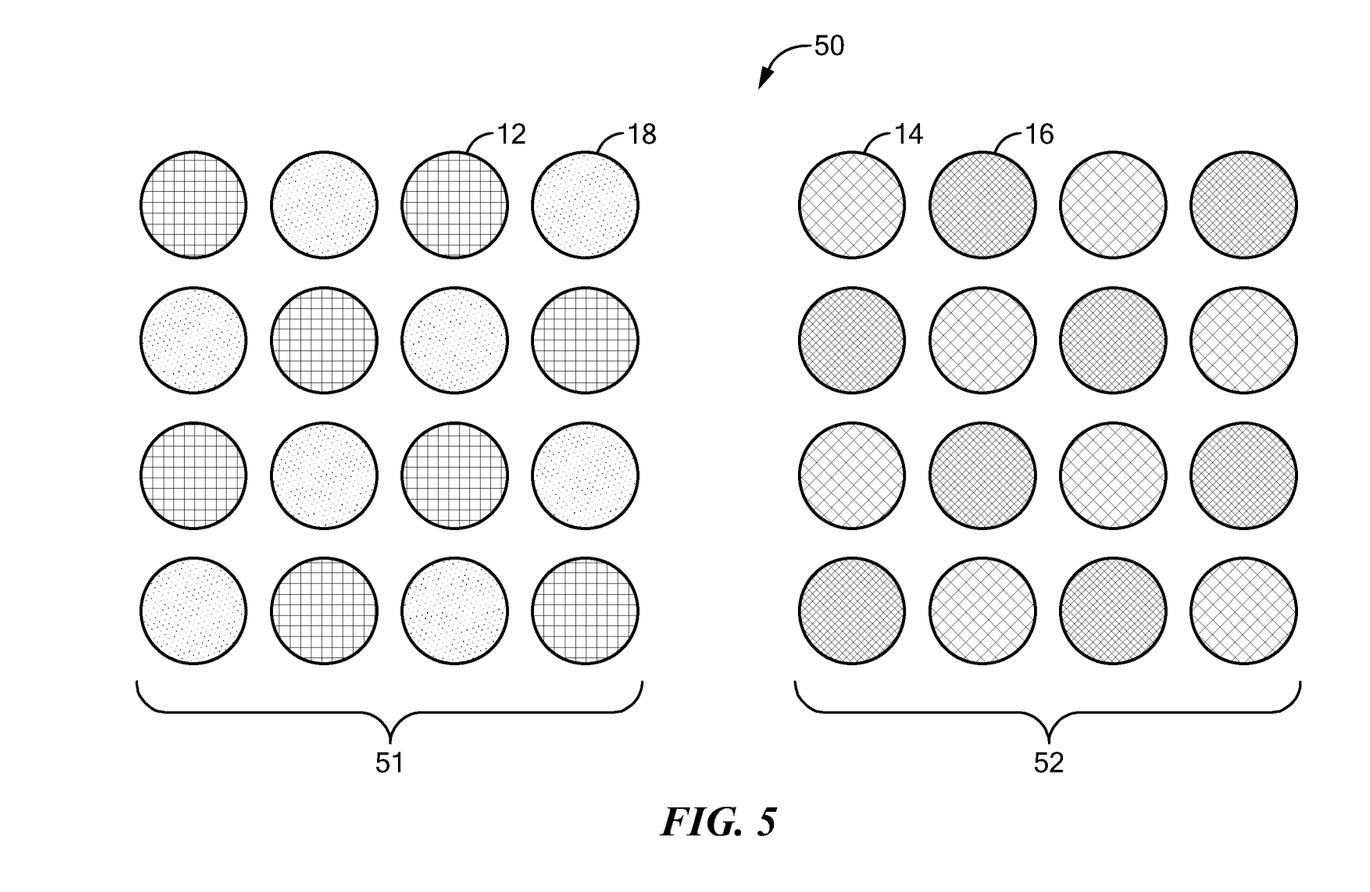
FIG. 5 is a diagram of a still further example of the layout of a TMR element.

Referring to FIG. 5, a still further example of a layout for the pillars is a layout 50. The layout 50 includes a first matrix 51 and a second matrix 52. In one example, a first matrix 51 is separated from the second matrix 52 by about 10 to 90 microns.

In the first matrix 51, the pillars 12 are interleaved with the pillars 18. For example, pillars 12 are diagonally interleaved with pillars 18.

In the second matrix 52, the pillars 14 are interleaved with the pillars 16. For example, pillars 14 are diagonally interleaved with pillars 16.

In one example, each pillar within a matrix is separated from the nearest pillar by about one to five microns.

The techniques described herein are not limited to the specific embodiments described herein. In some embodiments, the matrices do not have to be completely filled with pillars. For example, the periphery of a matrix may include dummy structures. In other embodiments, the size of the matrices is not limited to 4×4 matrices. A matrix may be any size or shape of matrix, such as for example, 8×1 or 16×16, 2×2, 16×1 and so forth depending, for example, on the number of pillars, space on the IC and so forth.

The techniques described herein may be used in bridges for magnetic-field sensors. As used herein, the term "magnetic-field sensor" is used to describe a circuit that uses a magnetic-field sensing element, generally in combination with other circuits. Magnetic-field sensors are used in a variety of applications, including, but not limited to, the angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic field density of a magnetic field.

Figure 6:
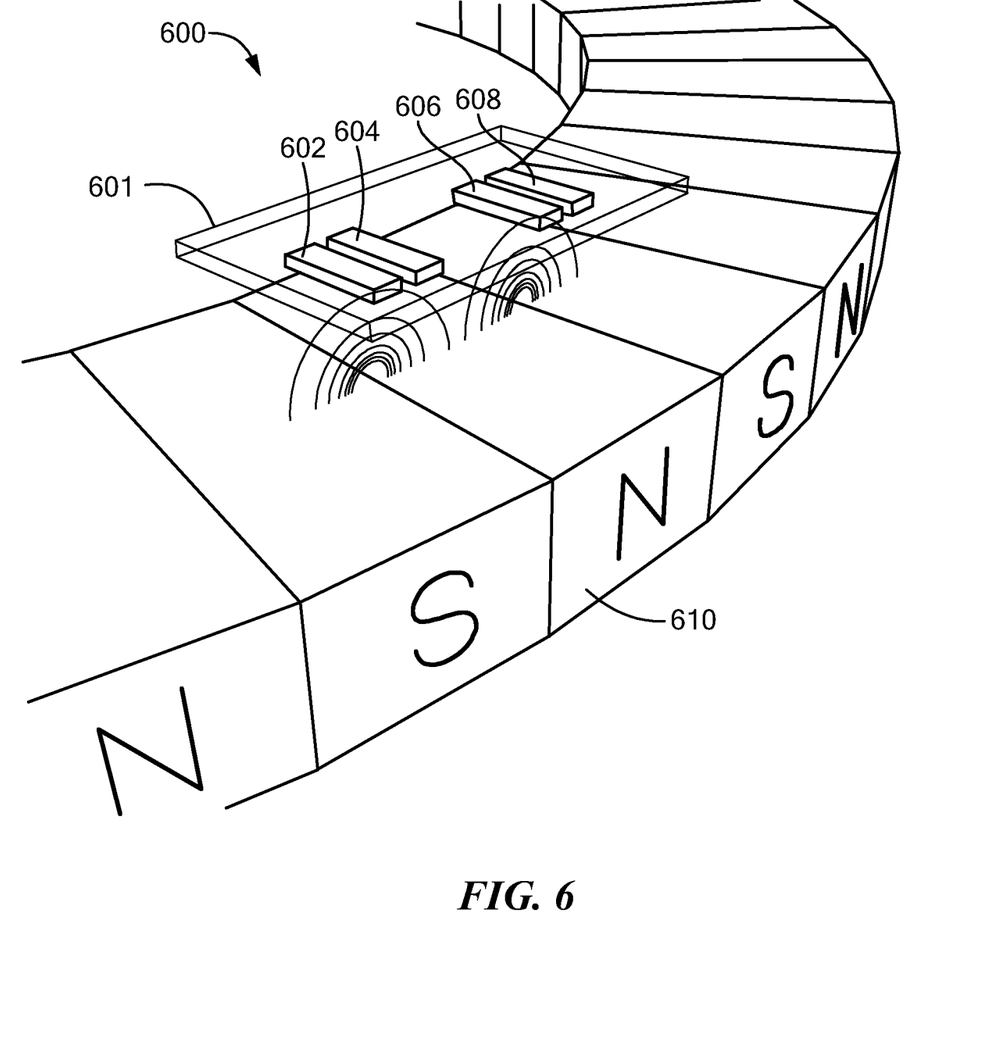
FIG. 6 is a diagram of an example of a magnetic sensor having a bridge.

Referring to FIG. 6, an example magnetic field sensor 600 including a plurality of TMR element structures (here, four TMR element structures 602, 604, 606, 608) is shown coupled in a bridge arrangement. The TMR element structures 602, 604, 606, 608, which can be the same as or similar to TMR element structures described in connection with figures above (e.g., FIGS. 2 to 5). It is understood that other configurations of the TMR element structures 602, 604, 606, 608 are, of course, possible. Additionally, it is understood that other electronic components (not shown), for example, amplifiers, analog-to-digital converters (ADC), and processors, i.e., an electronic circuit, can be disposed over substrate 601 and coupled to one or more of the TMR element structures 602, 604, 606, 608, for example, to process signals (i.e., magnetic field signals) produced by the TMR element structures 602, 604, 606, 608.

In the illustrated embodiment, the magnetic field sensor 600 is disposed proximate to a moving magnetic object, for example, a ring magnet 610 having alternative north and south magnetic poles. The ring magnet 610 is subject to motion (e.g., rotation) and the TMR element structures 602, 604, 606, 608 of the magnetic field sensor 600 may be oriented such that maximum response axes of the TMR element structures 602, 604, 606, 608 are aligned with a magnetic field (e.g., an applied magnetic field) generated by the ring magnet 610. In embodiments, the maximum responses axes of the TMR element structures 602, 604, 606, 608 may also be aligned with a magnetic field (e.g., a local magnetic field) generated by a magnet (not shown) disposed proximate to or within the magnetic field sensor 600. With such a back-biased magnet configuration, motion of the ring magnet 610 can result in variations of the magnetic field sensed by the TMR element structures 602, 604, 606, 608.

In embodiments, the TMR element structures 602, 604, 606, 608 are driven by a voltage source and configured to generate one or more magnetic field signals in response to motion of the ring magnet 610, e.g., in a first direction of motion and in a second direction of motion that is different than the first direction of motion. Additionally, in embodiments, one or more electronic components (e.g., ADC) (not shown) on the magnetic field sensor 600 are coupled to receive the magnetic fields signals and configured to generate an output signal indicative of position, proximity, speed and/or direction of motion of the ring magnet 610, for example. In some embodiments, the ring magnet 610 is coupled to a target object, for example, a cam shaft in an engine, and a sensed speed of motion of the ring magnet 610 is indicative of a speed of motion of the target object. The output signal (e.g., an output voltage) of the magnetic field sensor 600 generally has a magnitude related to a magnitude of the magnetic field experienced by the TMR element structures 602, 604, 606, 608.

Additionally, in embodiments in which the TMR element structures 602, 604, 606, 608 are provided as TMR element structures according to the disclosure (e.g., FIGS. 2 to 5), and the magnetic field sensor 600 includes electronic components (e.g., ADCs) coupled to receive magnetic field signals from the TMR element structures 602, 604, 606, 608 and configured to generate the output signal of the magnetic field sensor 600, operational requirements of the electronic components (e.g., so-called "front end electronics" or "signal processing electronics") may, for example, be reduced in comparison to embodiments in which the magnetic field sensor 600 includes conventional magnetoresistance elements.

While the magnetic field sensor 600 is shown and described as a motion detector to motion rotation of the ring magnet 610 in the illustrated embodiment, it is understood that other magnetic field sensors, for example, current sensors or angle sensors, may include one or more of the TMR element structures according to the disclosure.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A bridge comprising:
   a first magnetoresistance element comprising a first set of pillars;
   a second magnetoresistance element comprising a second set of pillars, the second magnetoresistance element being in series with the first magnetoresistance element;
   a third magnetoresistance element comprising a third set of pillars, the third magnetoresistance element being in parallel with the first magnetoresistance element; and
   a fourth magnetoresistance element comprising a fourth set of pillars, the fourth magnetoresistance element being in series with the third magnetoresistance element,
   wherein the first set of pillars and the fourth set of pillars are disposed in a first matrix and the second set of pillars and the third set of pillars are disposed in a second matrix.

2. The bridge of claim 1, wherein the first matrix comprises one or more columns comprising pillars from the first set of pillars adjacent to one or more columns comprising pillars from the fourth set of pillars.

3. The bridge of claim 2, wherein the second matrix comprises one or more columns comprising pillars from the second set of pillars adjacent to one or more columns comprising pillars from the third set of pillars.

4. The bridge of claim 1, wherein the first matrix comprises columns alternating between a column comprising pillars from the first set of pillars and a column comprising pillars from the fourth set of pillars.

5. The bridge of claim 4, wherein the second matrix comprises columns alternating between a column comprising pillars from the second set of pillars and a column comprising pillars from the third set of pillars.

6. The bridge of claim 1, wherein the first matrix has the first set of pillars and the fourth set of pillars diagonally interleaved.

7. The bridge of claim 6, wherein the second matrix has the second set of pillars and the third set of pillars diagonally interleaved.

8. The bridge of claim 1, wherein the first matrix has submatrices comprising pillars from the first set of pillars interleaved with submatrices comprising pillars from the fourth set of pillars.

9. The bridge of claim 8, wherein the second matrix has submatrices of pillars from the second set of pillars interleaved with submatrices of pillars from the third set of pillars.

10. The bridge of claim 1, wherein the first, second, third type and fourth magnetoresistance elements are tunnel magnetoresistance (TMR) elements.

11. The bridge of claim 10, wherein the first magnetoresistance element has the reference direction as the fourth magnetoresistance element.

12. The bridge of claim 1, wherein the first set of pillars are connected in series.

13. The bridge of claim 1, wherein the first set of pillars are connected in parallel.

14. The bridge of claim 1, wherein the first set of pillars comprises pillars connected in series and pillars connected in parallel.

15. The bridge of claim 1, wherein the first matrix and the second matrix are separated by at least 10 microns,
   wherein each pillar within the first or second matrix is separated from a nearest pillar by about one to two microns.

16. A magnetic-field sensor comprising:
   a bridge comprising:
      a first magnetoresistance element comprising a first set of pillars;

a second magnetoresistance element comprising a second set of pillars, the second magnetoresistance element being in series with the first magnetoresistance element;

a third magnetoresistance element comprising a third set of pillars, the third magnetoresistance element being in parallel with the first magnetoresistance element; and a fourth magnetoresistance element comprising a fourth set of pillars, the fourth magnetoresistance element being in series with the third magnetoresistance element, wherein the first set of pillars and the fourth set of pillars are disposed in a first matrix and the second set of pillars and the third set of pillars are disposed in a second matrix.

17. The magnetic-field sensor of claim 16, wherein the first matrix comprises one or more columns comprising pillars from the first set of pillars adjacent to one or more columns comprising pillars from the fourth set of pillars, wherein the second matrix comprises one or more columns comprising pillars from the second set of pillars adjacent to one or more columns comprising pillars from the third set of pillars.

18. The magnetic-field sensor of claim 16, wherein the first matrix comprises columns alternating between a column comprising pillars from the first set of pillars and a column comprising pillars from the fourth set of pillars, wherein the second matrix comprises columns alternating between a column comprising pillars from the second set of pillars and a column comprising pillars from the third set of pillars.

19. The magnetic-field sensor of claim 16, wherein the first matrix has the first set of pillars and the fourth set of pillars diagonally interleaved, wherein the second matrix has the second set of pillars and the third set of pillars diagonally interleaved.

20. The magnetic-field sensor of claim 16, wherein the first matrix has submatrices comprising pillars from the first set of pillars interleaved with submatrices comprising pillars from the fourth set of pillars, wherein the second matrix has submatrices of pillars from the second set of pillars interleaved with submatrices of pillars from the third set of pillars.

21. The magnetic-field sensor of claim 16, wherein the magnetic-field sensor is an angle sensor.

\* \* \* \* \*

UNITED STATES PATENT AND TRADEMARK OFFICE
CERTIFICATE OF CORRECTION

PATENT NO. : 11,187,764 B2
APPLICATION NO. : 16/825368
DATED : November 30, 2021
INVENTOR(S) : Rémy Lassalle-Balier et al.

It is certified that error appears in the above-identified patent and that said Letters Patent is hereby corrected as shown below:

In the Specification

Column 4, Line 56 delete "608, which can" and replace with --608, can--.

Column 5, Line 11 delete "responses" and replace with --response--.

Column 5, Line 30 delete "cam shaft" and replace with --camshaft--.

Signed and Sealed this
Fourteenth Day of February, 2023

Katherine Kelly Vidal
*Director of the United States Patent and Trademark Office*